United States Patent
Syed et al.

(10) Patent No.: US 11,397,544 B2
(45) Date of Patent: Jul. 26, 2022

(54) MULTI-TERMINAL NEUROMORPHIC DEVICE

(71) Applicant: International Business Machines Corporation, Armonk, NY (US)

(72) Inventors: Ghazi Sarwat Syed, Zurich (CH); Abu Sebastian, Adliswil (CH); Timoleon Moraitis, Glattpark (CH); Benedikt Kersting, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/094,708

(22) Filed: Nov. 10, 2020

(65) Prior Publication Data

US 2022/0147271 A1    May 12, 2022

(51) Int. Cl.
*G06F 3/06*    (2006.01)
*H01L 45/00*   (2006.01)
(Continued)

(52) U.S. Cl.
CPC .......... *G06F 3/0659* (2013.01); *G06F 3/0604* (2013.01); *G06F 3/0679* (2013.01);
(Continued)

(58) Field of Classification Search
CPC ...... G06N 3/063; G06N 3/0635; G06N 3/049; G06N 3/0445; G06N 3/0454; G06N 3/08;
(Continued)

(56) References Cited

U.S. PATENT DOCUMENTS

| 8,923,039 B2 | 12/2014 | Annunziata |
| 9,547,819 B1 | 1/2017 | Gotsmann |

(Continued)

FOREIGN PATENT DOCUMENTS

| CN | 107945829 A | 4/2018 |
| CN | 110168761 A | 8/2019 |

(Continued)

OTHER PUBLICATIONS

Zhang et al., "Truly concomitant and independently expressed short- and longterm plasticity in Bi2O2Se-based three-terminal memristor", Wiley Online Library, 10.1002/adma.201805769, 39 pages, Nov. 20, 2018.

(Continued)

*Primary Examiner* — Thong Q Le
(74) *Attorney, Agent, or Firm* — Mark Bergner

(57) ABSTRACT

A neuromorphic memory element comprises a memristor, a plurality of the neuromorphic memory elements and a method for operating the same may be provided. The memristor comprises an input signal terminal, an output signal terminal, and a control signal terminal, and a memristive active channel comprising a phase change material. The memristive active channel extends longitudinal between the input signal terminal and the output signal terminal, and a control signal voltage at the control signal terminal is configured to represent volatile biological neural processes of the neuromorphic memory element, and a bias voltage between the input signal terminal and the output signal terminal is configured to represent non-volatile biological neural processes of the neuromorphic memory element.

20 Claims, 8 Drawing Sheets

(51) Int. Cl.
*G11C 11/54* (2006.01)
*G11C 13/00* (2006.01)
*G06N 3/04* (2006.01)

(52) U.S. Cl.
CPC ............ *G06N 3/04* (2013.01); *G11C 11/54* (2013.01); *G11C 13/004* (2013.01); *G11C 13/0004* (2013.01); *G11C 13/0069* (2013.01); *H01L 45/06* (2013.01); *H01L 45/1206* (2013.01); *G11C 2213/53* (2013.01)

(58) Field of Classification Search
CPC ........ G06N 3/0481; G06N 3/084; G06N 3/04; G06F 11/2028; G06F 17/13; G06F 17/15; G06F 30/20; G06F 30/36; G06F 7/523; G06F 7/58; G11C 13/00; G11C 11/22; G11C 11/44; G11C 14/00; G11C 5/02; G11C 7/06; G11C 13/0069; G11C 13/004; G11C 13/0007; G11C 13/0004; G11C 13/003; G11C 13/0002; G11C 2213/17; G11C 2213/78; G11C 11/54; G11C 11/5678; G11C 16/10; G11C 2213/32; G11C 2213/75; G11C 11/5614; G11C 11/5685; G11C 13/0011; G11C 2213/79; G11C 2213/34; G11C 2213/77; G11C 13/0023; G11C 13/0064; G11C 13/0097; G11C 13/025; G11C 2213/19; G11C 7/1006; G11C 13/0038; G11C 2013/0045; G11C 2013/0088; G11C 2213/72; G11C 11/06035; G11C 13/0026; G11C 14/009; G11C 16/0483; G11C 2213/15; G11C 2213/55; G11C 2213/74; G11C 2013/009; G11C 13/0021; G11C 16/26; G11C 16/3427; G11C 2013/0078; G11C 2013/0092; G11C 11/16; G11C 11/56; G11C 11/5607; G11C 13/04; G11C 13/047; G11C 16/06; G11C 16/08; G11C 16/16; G11C 16/3445; G11C 2013/0054; G11C 2013/0073; G11C 2213/33; G11C 8/08; G11C 8/12; G11C 111/5671; G11C 13/0028; G11C 13/0061; G11C 16/04; G11C 16/0458; G11C 16/28; G11C 17/165; G11C 2213/31; G11C 2213/53; G11C 7/16; H01L 27/249; H01L 45/08; H01L 45/4226; H01L 45/146; H01L 45/06; H01L 45/065; H01L 45/085
USPC ............ 365/148, 100, 163, 189.011, 189.15, 365/189.16; 711/104
See application file for complete search history.

(56) References Cited

U.S. PATENT DOCUMENTS

| | | |
|---|---|---|
| 9,548,741 B1 | 1/2017 | Kvatinsky |
| 9,691,479 B1 | 6/2017 | Merced Grafals |
| 9,847,129 B2 | 12/2017 | Buchanan |
| 10,497,866 B1 | 12/2019 | Fuller et al. |
| 10,553,793 B2 | 2/2020 | Jha et al. |
| 2014/0211540 A1 | 7/2014 | Papandreou |
| 2015/0256178 A1 | 9/2015 | Kvatinsky |
| 2016/0189774 A1 | 6/2016 | Xie |
| 2016/0267379 A1 | 9/2016 | Eleftheriou |
| 2017/0125096 A1 | 5/2017 | Papandreou |
| 2017/0221558 A1 | 8/2017 | Hu |
| 2019/0065929 A1 | 2/2019 | Koelmans et al. |
| 2019/0164038 A1 | 5/2019 | Zhang |
| 2019/0214557 A1 | 7/2019 | Bahar |
| 2019/0303751 A1 | 10/2019 | Werner et al. |
| 2020/0012924 A1* | 1/2020 | Ma .................. G06K 9/6271 |
| 2020/0161373 A1 | 5/2020 | Cheng |
| 2020/0227635 A1 | 7/2020 | Yang |
| 2021/0098611 A1* | 4/2021 | Hersam ............ H01L 29/78681 |

FOREIGN PATENT DOCUMENTS

| | | |
|---|---|---|
| CN | 110610984 A | 12/2019 |
| CN | 111275177 A | 6/2020 |
| JP | 2019161068 A | 9/2019 |

OTHER PUBLICATIONS

List of IBM Patents or Patent Applications Treated as Related, Nov. 10, 2020, 2 pgs.
Mohammad B. et al., "Hybrid Memristor-CMOS Memory Cell: Modeling and Design", Published Date:Dec. 22, 2011.
Koelmans, W.W., "Projected phase-change memory devices", Article in Nature Communications, 8 pages, Sep. 2015.
Ding, K. et al., "Phase-change heterostructure enables ultralow noise and drift for memory operation", Phase-Change Memory, Science 366, 210-215 (2019), 7 pages, DOI: 10.1126/science. aay0291, Downloaded from: http://science.sciencemag.org/.
Berdan, R., Vasilaki, E., Khiat, A. et al. Emulating short-term synaptic dynamics with memristive devices. Sci Rep 6, 18639 (2016). https://doi.org/10.1038/srep18639.
Ohno, T., Hasegawa, T., Tsuruoka, T. et al. Short-term plasticity and long-term potentiation mimicked in single inorganic synapses. Nature Mater 10, 591-595 (2011). https://doi.org/10.1038/nmat3054.
International Search Report and Written Opinion dated Jan. 28, 2022 from International Application No. PCT/IB2021/059858 filed Oct. 26, 2021.
International Application No. PCT/IB2021/059858 filed Oct. 26, 2021.
International Search Report and Written Opinion dated Jan. 27, 2022 from International Application No. PCT/IB2021/060194 filed Nov. 4, 2021.

* cited by examiner

MULTI-TERMINAL NEUROMORPHIC DEVICE

BACKGROUND

Disclosed herein is a neuromorphic memory element comprising a memristor, and more specifically, a neuromorphic memory element emulating synaptic brain behaviors. This disclosure in particular is directed to a plurality of the neuromorphic memory elements and a method for operating a neuromorphic memory element comprising a memristor.

Due to the growing trend of more and more available information in the scientific community as well as in enterprises, data analytics continues to be en vogue. In order to analyze the growing portion of unstructured or semi-structured data, artificial intelligence techniques—very often in the form of machine-learning systems—are used. The machine learning systems are very often implemented as artificial neural network systems based on classical von-Neumann architectures. This architecture typically performs the cycle of fetch command/data, execute, and optionally store back. The CPU (central processing unit) is connected to a system memory via a bus system.

In contrast to this conventional von-Neumann architecture, the human brain comprises a large number of neurons with synapses, each of them acting as both, the computing and the memory, hence, a biological in-memory computing system. This unique structure makes the brain extremely energy-efficient in dealing with emotions, learning, and thinking. E.g., simulating five seconds of brain activity that operates at 20 W of power using state-of-the-art supercomputers takes around several 100 seconds and may need kW or even up to a MW of power. In the circuitry of such a natural neural network, a neuron integrates inputs from other neurons, while the synapse relays the signals. Synapses outnumber neurons by several orders of magnitude, and the processes of learning and memory in the network are associated with the synapses (synaptic efficiency or weight).

SUMMARY

According to one aspect of the present invention, a neuromorphic memory element comprising a memristor is provided. The memristor may comprise an input signal terminal, an output signal terminal, and a control signal terminal. The neuromorphic memory element may also comprise a memristive active channel comprising a phase change material, wherein the memristive active channel extends longitudinal between the input signal terminal and the output signal terminal.

The control signal voltage at the control signal terminal may be configured to represent volatile biological neural processes of the neuromorphic memory element, and a bias voltage between the input signal terminal and the output signal terminal may be configured to represent non-volatile biological neural processes of the neuromorphic memory element.

According to a further aspect, a method for operating a neuromorphic memory element comprising a memristor is provided. The memristor may comprise an input signal terminal, an output signal terminal, and a control signal terminal, a memristive active channel comprising a phase change material. The memristive active channel may extend longitudinally between the input signal terminal and the output signal terminal.

The method may also comprise applying a control signal voltage to the control signal terminal representing volatile biological neural processes of the neuromorphic memory element, and applying a bias voltage between the input signal terminal and the output signal terminal representing non-volatile biological neural processes of the neuromorphic memory element.

BRIEF DESCRIPTION OF THE SEVERAL VIEWS OF THE DRAWINGS

Embodiments of the invention are described with reference to different subject-matter. In particular, some embodiments are described with reference to method type claims, whereas other embodiments are described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within this document.

The aspects defined above, and further aspects of the present disclosure, are apparent from the examples of embodiments to be described hereinafter and are explained with reference to the examples of embodiments, but to which the invention is not limited.

Figure 1:
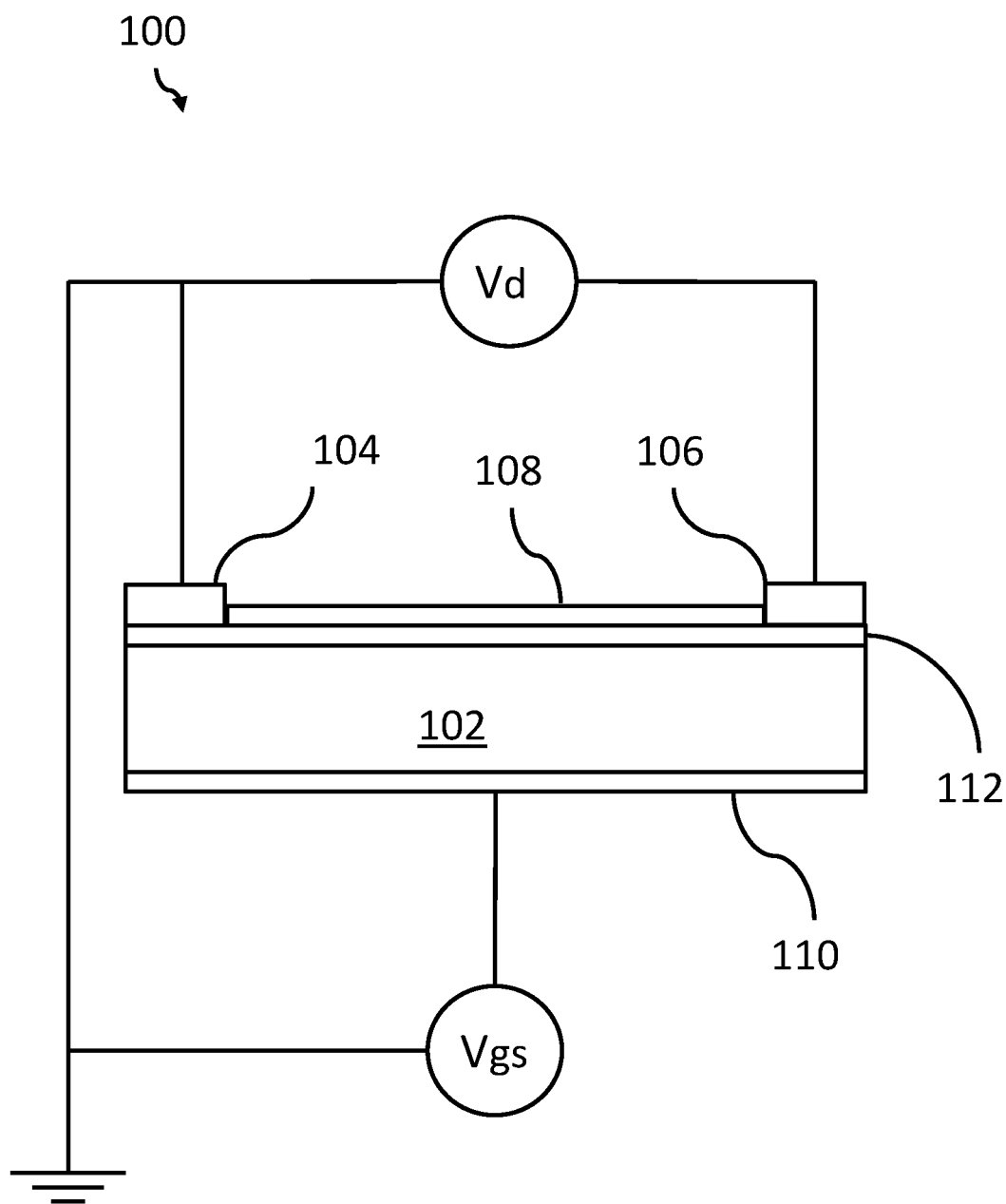

Various embodiments will be described, by way of example only, and with reference to the following drawings:

FIG. 1 is a schematic block diagram of an embodiment of the inventive neuromorphic memory element comprising a memristor, according to some embodiments.

Figure 2:
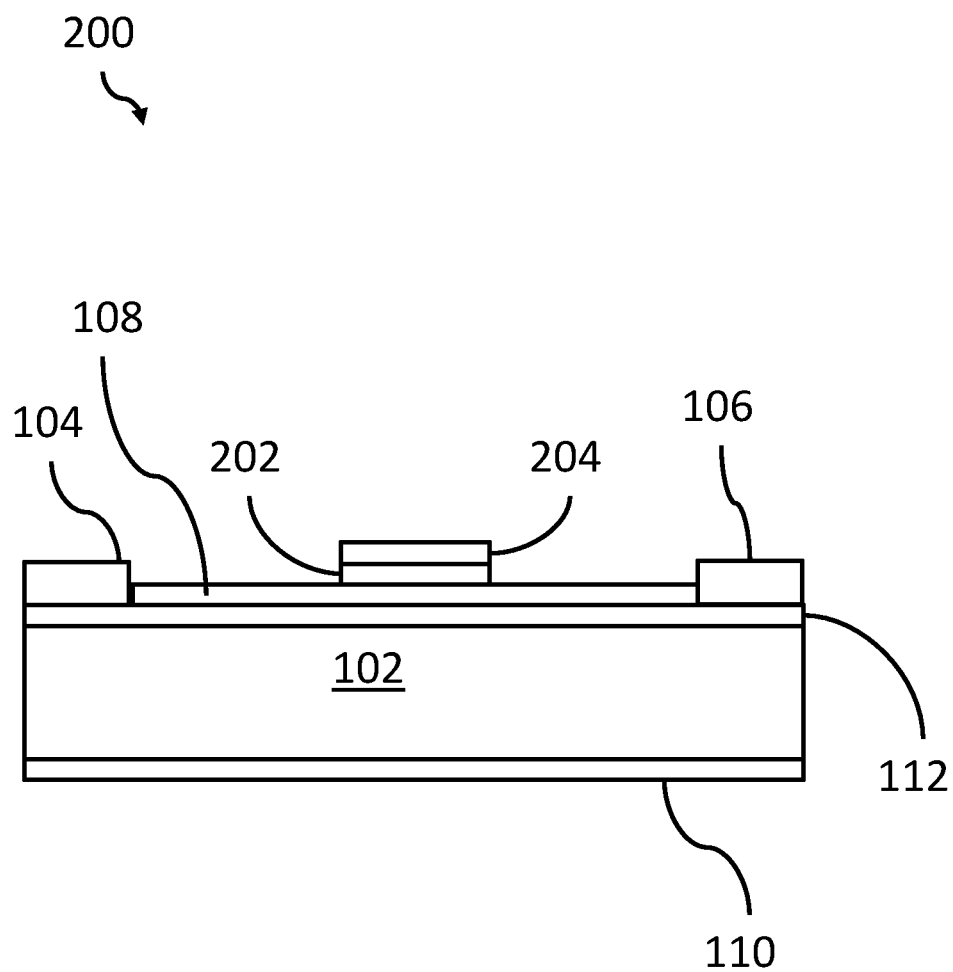

FIG. 2 is a schematic block diagram showing an alternative embodiment of the neuromorphic memory element.

Figure 3:
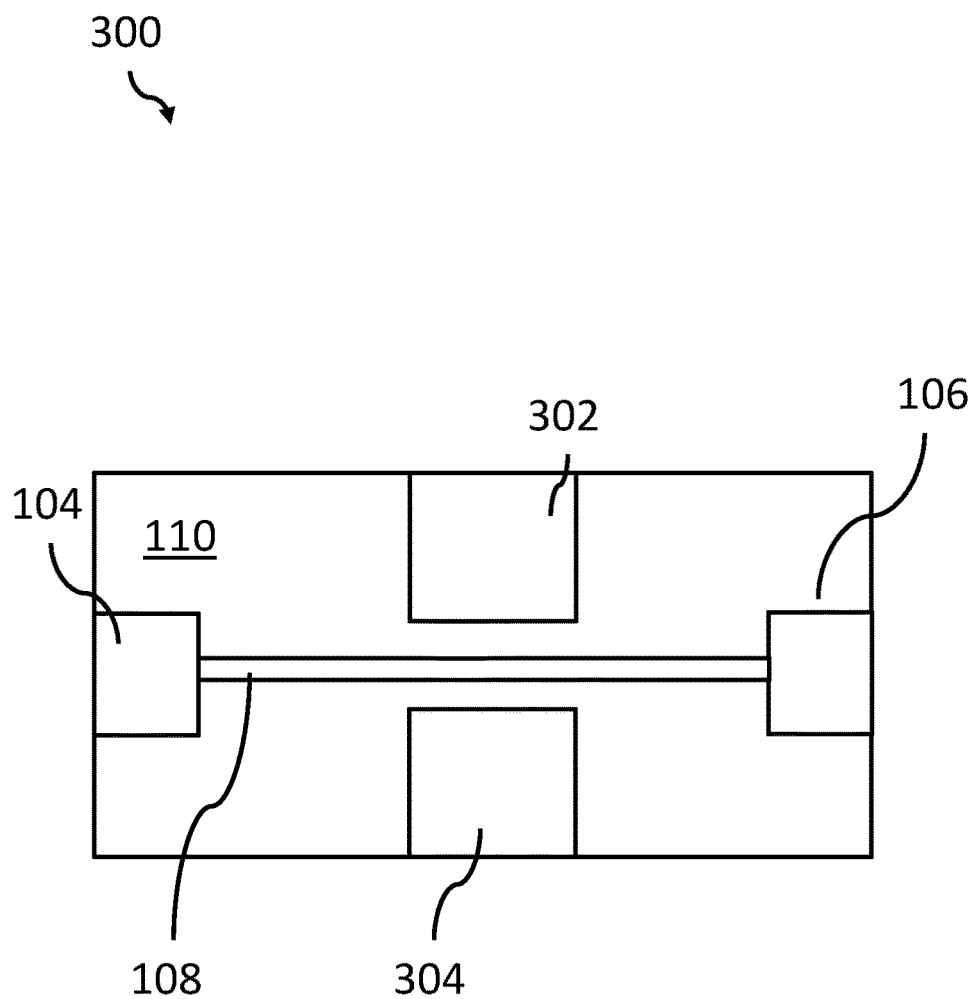

FIG. 3 is a block diagram showing an embodiment having a second top gate and optionally also a third top gate.

Figure 4A:
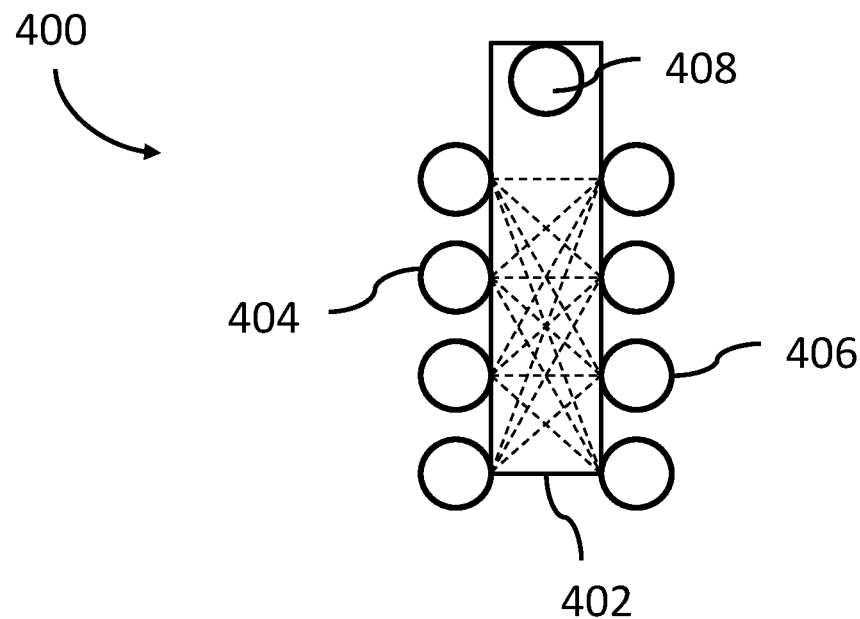

FIG. 4A is a block diagram that illustrates the effect of homeoplasticity using a global gate, according to some embodiments.

Figure 4B:
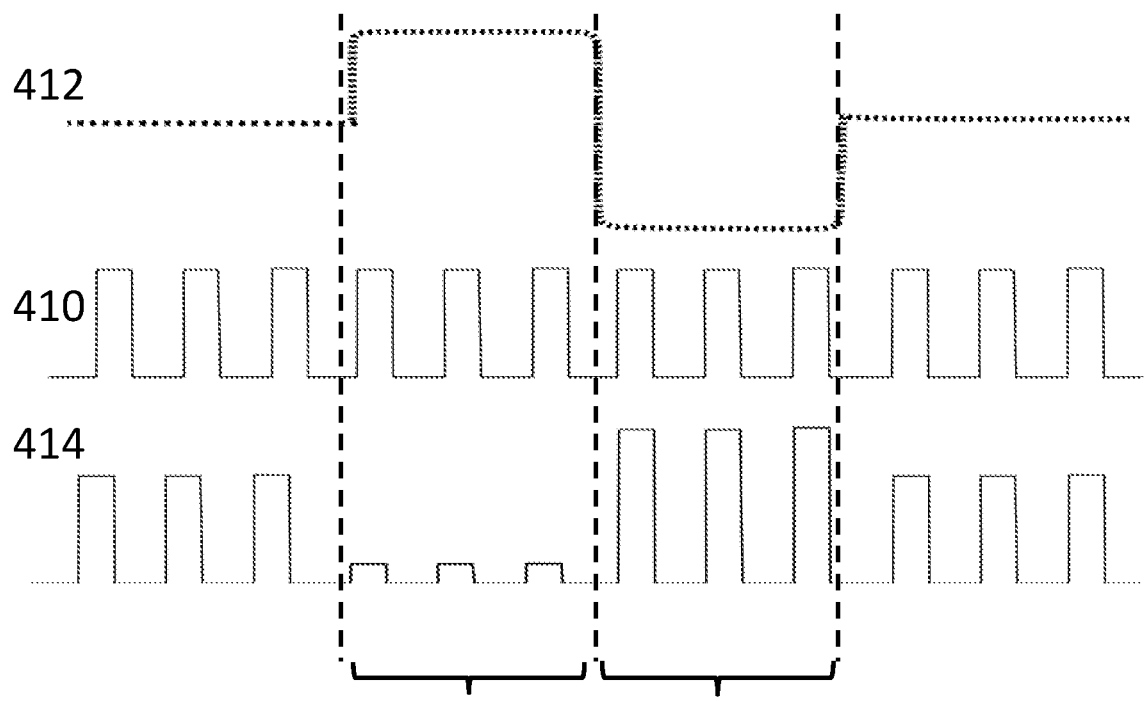

FIG. 4B is a timing diagram that shows presynaptic signals and postsynaptic signals depending on a voltage applied to a global gate, according to some embodiments.

Figure 5A:
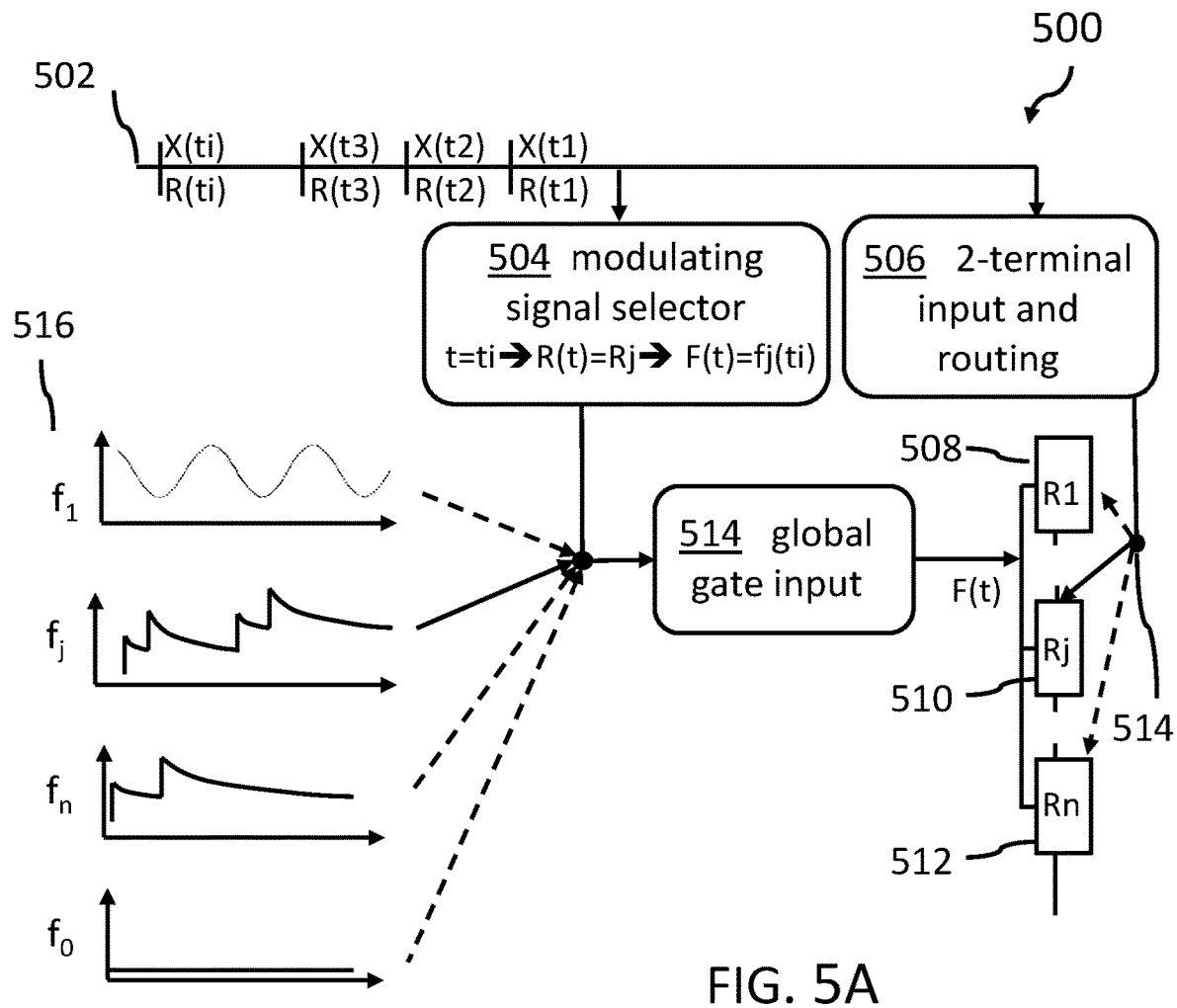

FIG. 5A is a block timing diagram that shows an embodiment for a first approach for STP utilizing a global gate, according to some embodiments.

Figure 5B:
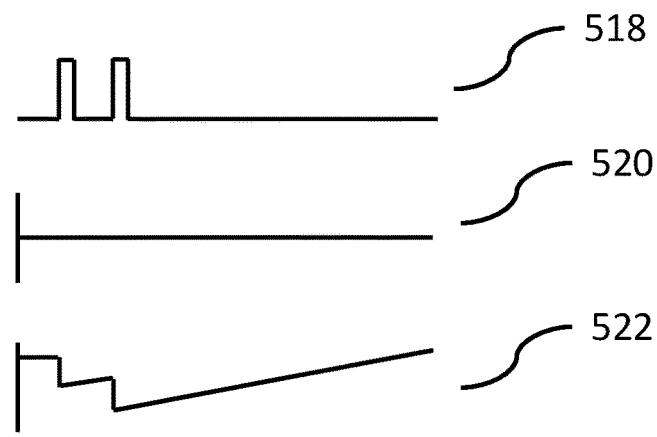

FIG. 5B is a timing diagram that shows typical signals development of time emulating device level STP-fatigue, according to some embodiments.

Figure 6:
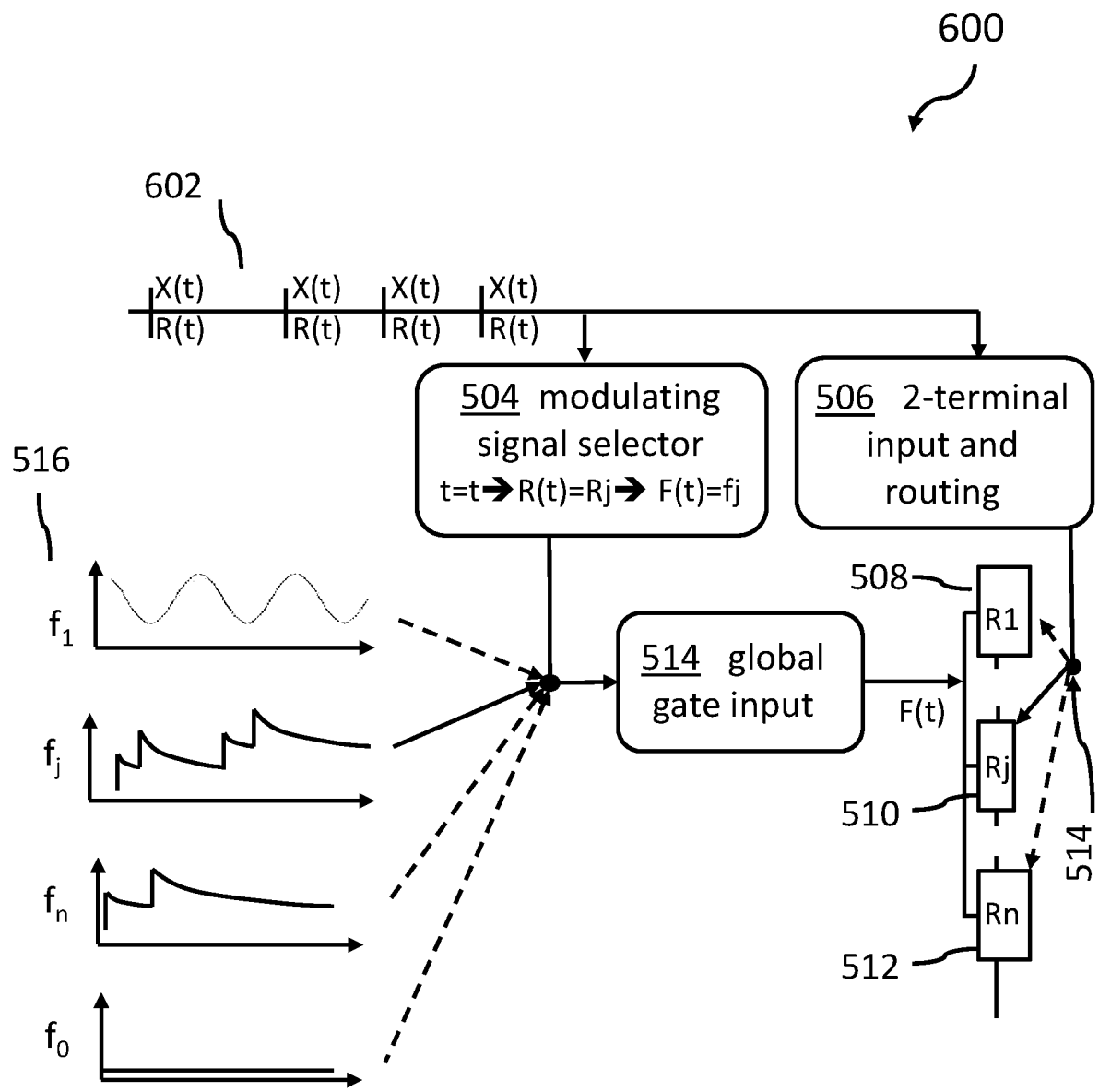

FIG. 6 is a timing block diagram that shows an embodiment for a second approach for STP utilizing a global gate, according to some embodiments.

Figure 7:
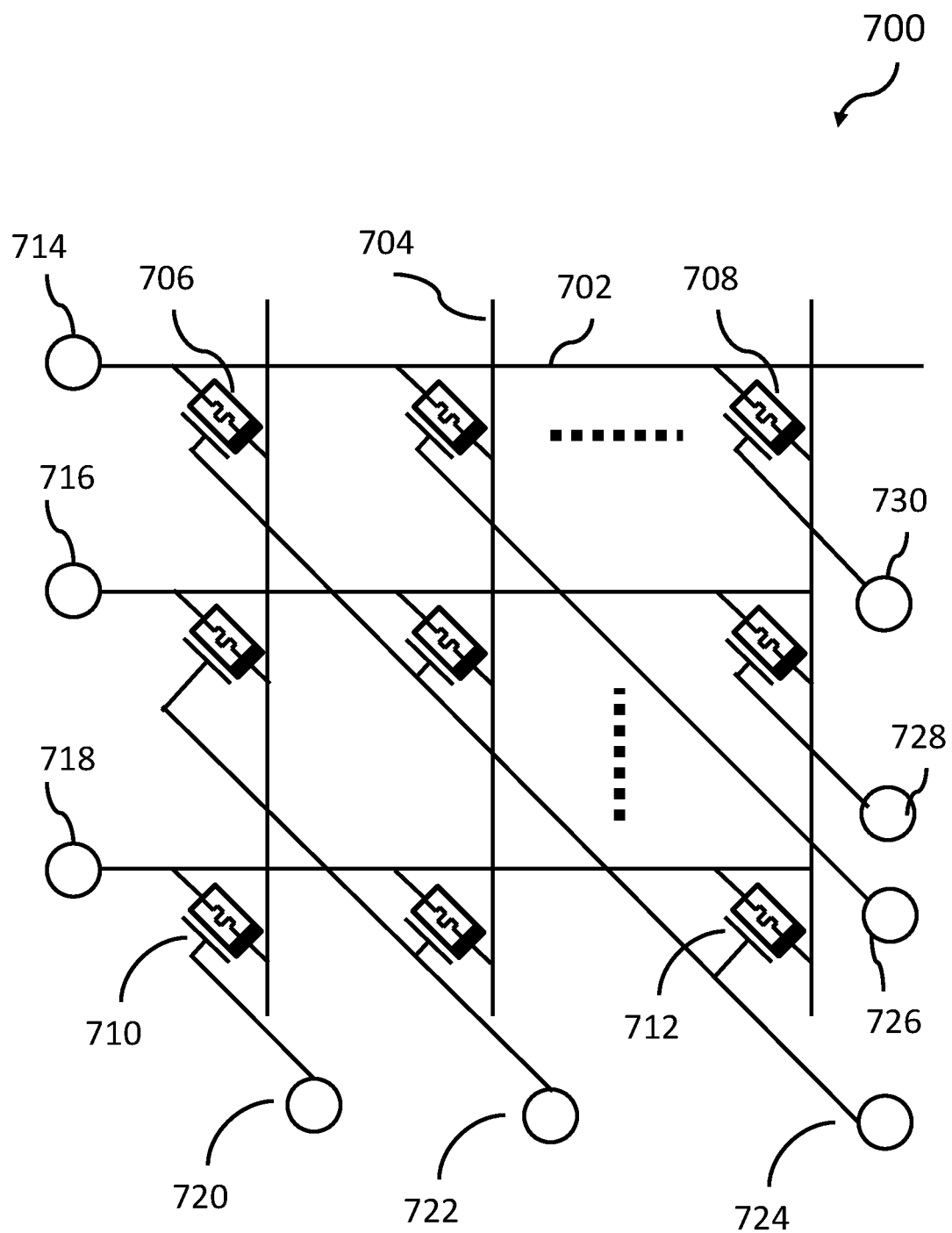

FIG. 7 is a schematic diagram that shows an example embedding of a plurality of the neuromorphic memory elements into a crossbar array, according to some embodiments.

Figure 8:
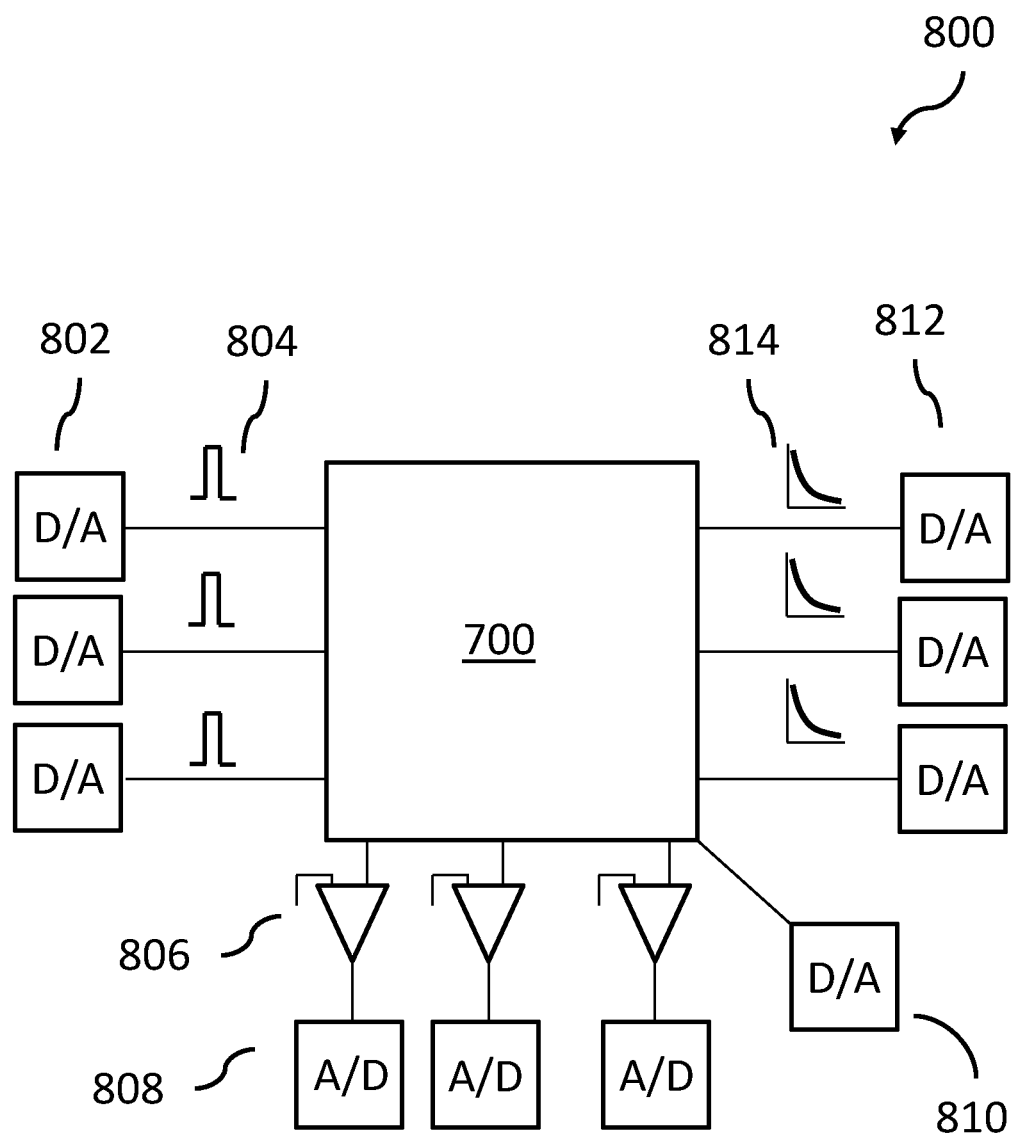

FIG. 8 is a schematic block diagram that shows components for operating the crossbar array of the plurality of the neuromorphic memory elements, according to some embodiments.

DETAILED DESCRIPTION

An area to drive neuromorphic platforms for both enhancing existing and enabling newer applications is to make the neurons and synapses more and more brain inspired. This may require radical rethinking to the man-made device concepts that emulate the synaptic dynamics. It is known that multiple independent processes govern synaptic efficiency, which can broadly be categorized into two categories, namely: long-term plasticity (LTP) and short-term plasticity (STP). Based on this, the synaptic efficiency (G) can be expressed as a function:

$$G(t)=\alpha(t)*W(t)*F(t)$$

where:
W (t) represents the long-term plasticity (W),
F (t) represents the short-term plasticity (F), and
α(t) may be associated with changes in the networks medium (homeostasis) and could represent multiplicative mathematical operations (e.g., addition, subtraction).

Homeostasis represents global modulations underlying the synapses (homeo- or homeostatic plasticity). This is mainly controlled by ionic concentrations, concentration of various hormones and temperature, just to name a few parameters that provide global regulation of synaptic strength and neural firing.

W(t) is associated with long-term memory and F(t) is associated with the short-term memory, sometimes also denoting an effect called synaptic fatigue/facilitation. Additionally, neurons may exhibit a variety of temporal dynamics, such as adaptive threshold and membrane leak. Thus:

$$T'(t)=\alpha(t)*T(t)*K(t);$$

where:
T'(t) represents a dynamic firing threshold of a neuron,
T(t) represents resting firing threshold of a neuron, and
α(t) is associated with changes in the network's medium (homeostasis).

Furthermore, for the synaptic characteristic, it is known that:

$$K'(t)=\alpha(t)*K(t);$$

where
K'(t) represents a transient voltage trajectory in the post-synaptic signal,
K(t) represents a pre-synaptic signal or post-synaptic decay tail, and
α(t) can be associated with changes in the network's medium (homeostasis).

Today's available neuromorphic hardware, synaptic and neural dynamics are typically realized using conventional CMOS and memristive circuitry. Implementations comprise two transistors/one memristor solutions, as well as one transistor/one memristor solutions (for e.g., simulating a synapse). One of the challenges underlying working with memristors to be fully tunable may require non-memristive circuitry that complicates device manufacturing and are often not tied to device physics.

Trying to simulate a synapse with a projected phase change memory device with a phase change memory as a core, a middle layer surrounded by an active channel surrounded by a gate oxide and surrounded by a gate has proven problematic. To be fully tunable, the device requires additional material (active channel), which complicates the manufacturing process and decreases the operational efficiency of the memristor.

A third approach can be seen in a PCM (phase change memory) device implementing an integrate-and-fire neuron by integrating inputs in the PCM conductance state, and resetting once the conductance reaches a firing threshold. The memristive conductance, in this case, represents the membrane potential of the neuron. However, this solution also has setbacks: there is no "membrane leak" which may be required for some spatiotemporal data computations, and there are no threshold dynamics which are required for adoptive learning.

Hence, the currently available technical models of a synapse or a neuron have only limited potential to simulate a fully functional synapse/neuron network due to limited neural dynamics modeling options. Therefore, there may be a need for a neuromorphic device allowing a better simulation of synaptic activities.

In the context of this description, the following conventions, terms and/or expressions may be used.

The term "neuromorphic memory element" may denote here a multi-terminal device—i.e., at least a 3-terminal memristive device—without the requirement for separated PCM and active layers. Instead, the PCM layer or core and the active channel are the same, omitting one layer of material. The neuromorphic memory element may be used for an emulation of synaptic effects known from mammalian brains.

The term "memristor" (i.e., a portmanteau of memory and resistor) may refer the known non-linear, two-terminal electrical component relating electric charge and magnetic flux. However, in the concept discussed here, the non-linear characteristic of the memristor may be influenced by additional gates. The resistance value may be adaptable between several levels during a write operation. The so programmed resistance value keeps its value even if no voltage is applied to the memristor. However, over time, the resistance value may change due to a non-ideal behavior of such devices. The once programmed resistance value may be read out so that the memristor may be used as a memory or storage base element.

The term "memristive active channel" may denote here a channel of a PCM connected between an input terminal and an output terminal.

The term "phase change material" (PCM) may—in the context of memristors—denote a transition between states of the material, e.g., between non-classical (in contrast to the classical states liquid and solid) states of matter, such as the conformity of crystals, where the material goes from conforming to one crystalline structure to conforming to another, which may be a higher or lower energy state, i.e., a crystalline state to an amorphous state showing different electrical conductance.

The term "volatile biological neural processes" may denote short-term effects, e.g., in the context of short-term memory, e.g., due to leaky behavior of a neuron's membrane. This effect may—in the context synapses—also be denoted as synapse fatigue.

The term "non-volatile biological neural processes" may denote long term effects associated with long term memory of mammalian brains. It may also be denoted as long-term plasticity (LTP).

The term "long-term plasticity" (LTP) may be related to synaptic plasticity in brain models—i.e., in neuroscience—and may denote—in particular, in the form of synaptic plasticity—the ability of synapses to strengthen or weaken over time, which is important for neurochemical foundations of learning and memory. LTP should not be confused with long-term potentiation, which remains in contrast to long-term depression (LTD), both of which can be affected in mammalian brains through the availability of neurotransmitters and hormones, both of which are the basis for long-term (synaptic) plasticity. Typically, LTP effects may last from minutes to hours.

The term "short-term plasticity" (STP)—in particular, short-term synaptic plasticity in contrast to long-term synaptic plasticity—may denote effects of synaptic activities in a shorter time frame than LTP. Short-term synaptic plasticity may act on a timescale of tens of milliseconds to a few minutes. Hence, STP and LTP effects may be clearly differentiated. Also, short term plasticity can either strengthen or weaken a synapse.

The proposed neuromorphic memory element comprising a memristor, the plurality of the neuromorphic memory elements, and the method to operate the same may offer multiple advantages, contributions and technical effects.

The proposed solution may overcome problems found in projected PCM based synaptic elements, in which a phase change memory is surrounded by an active channel, a gate oxide, and an outer gate. Such configurations are comparably difficult to manufacture and require comparably large volumes. Furthermore, in such configurations, an active channel material may be required which may be omitted in the proposed solution here. In contrast, in the proposed device, the active channel and the face change material may be identical, hence, the operational efficiency of the memristor may be enhanced and neuronal dynamics may also be emulated.

By using the intrinsic field effect property of memristors, the proposed approach may eliminate the need of a projection layer. Thus, material costs, time, and labor may be brought down, and complexities eliminated in the chip design and its fabrication.

By utilizing a back gate configuration, the various embodiments may enable a gate level modulation of a neuronal network implemented using a plurality of the proposed neuromorphic devices. In particular, in hybrid devices, the back gate may enable a global modulation, while selective gates may facilitate local modulations specific to a single neuromorphic device.

Moreover, by eliminating the core projection layer for phase change memory devices, the thermal confinement in the device may be improved, and the electrical power consumption may be decreased. Overall, this may lead to a significant improvement in the energy expenditure for operating the proposed devices.

The field effect introduced by the gate (in any form) may be used to represent the firing threshold of a neuron and implement a long-term value of the threshold in the non-volatile state of the device, and additionally a dynamic or adaptive threshold by tuning the gate of the device. As a biological background, a neuron integrates pre-synaptic pulses, and if the accumulation exceeds a firing threshold, it also fires a post-synaptic impulse. The firing threshold, however, is not a constant and, in the schema of adaptive learning, its magnitude changes.

The field effect introduced by the gate of the device can also be used to enable characteristics of a leaky neural membrane by adding transient non-linearity to the simulated neuron. As a biological background, the delay in the build-up and fall of the post synaptic signal is due to the leaky behavior of neuron's membrane. The voltage trajectory of a leaky integrate-and-fire model is essential to how most sensory information is processed. If a pre-synaptic impulse has vertical edges, for leaky membranes, the post-synaptic pulses have rounded edges.

In a nutshell, the complete repertoire of characteristics of a biological synapse may be emulated which may enable a much more natural behavior of artificial neural networks. Both volatile and non-volatile neural processes may be realized using the memristive active channel.

In the following, additional embodiments of the device—also applicable to the related method—are described.

According to some advantageous embodiments of the neuromorphic memory element, the neuromorphic memory element may be configured to emulate long-term plasticity (LTP) dynamics via non-volatile modulation of a memristor conductance of the memristor during a write operation, i.e., during a programming operation. The neuromorphic memory element may also be configured to emulate short-term plasticity (STP) dynamics via volatile modulation of the memristor conductance during a read operation. With this, the neuromorphic memory element may be configured to emulate neuronal dynamics via volatile modulation of the memristor conductance during the read and write operations. Hence, the novel neuromorphic device may allow simulating or emulating the complete complex behavior of a natural, biological synapse including short-term, long-term local, as well as global effects. This may make the device ideal to even better build artificial neural networks.

According to some embodiments of the neuromorphic memory element, the memristive device may comprise a top surface and a back surface, a first dielectric material layer atop the top surface of the carrier material, a source terminal, and a drain terminal connected by the memristive active channel atop the dielectric material. Furthermore, the memristive device may comprise a back gate below the first dielectric material layer. In-between the first dielectric material layer and the back gate, a carrier material may be positioned. It may comprise a silicon base material. Additionally, the back gate may also comprise conductive material.

According to some embodiments of the neuromorphic memory element, the memristive device may comprise a carrier material having: a source terminal and a drain terminal connected by the memristive active channel atop the carrier material, a dielectric material layer atop the memristive active channel, and a control gate atop the dielectric material layer.

These embodiments may be seen as a direct alternative to the previously described embodiments. However, here, the back gate may be replaced by the control gate over the active channel and may be used in the same way the back gate may be used as described below, e.g., as global gate for a plurality of neuromorphic memory element having a common top control gate.

According to some alternative embodiments of the neuromorphic memory element, the carrier material may be conductive and it may be the back gate directly. Hence, the carrier material and the back gate may be the same. This may reduce the production effort and also the cost of the neuromorphic memory element. However, in selected situations, the version of the neuromorphic memory element, having an explicit carrier material, may be a more practical approach, e.g., if also other active elements—e.g., in CMOS technology—may be integrated together with one or more of the neuromorphic memory elements.

According to further alternative embodiments of the neuromorphic memory element, the carrier material may be a metal or a highly doped semiconductor, e.g., highly doped silicon. The conductive silicon (or another semiconductor) may be attached to a connection terminal to be wired to a gate voltage source.

According to further alternative embodiments of the neuromorphic memory element, the carrier material may be a silicon substrate, and the back gate may be a conductive layer atop the back surface of the silicon substrate. The conductive layer atop the back surface of the silicon substrate (or another semiconductor as carrier material) may typically be a metal gate.

According to some alternatively designed embodiments, the neuromorphic memory element may comprise a second dielectric material layer atop the memristive active channel, and a first top gate atop the second dielectric material layer. However, another material layer may be positioned between the active channel and the second dielectric material layer. The first top gate may influence the characteristics alternatively and/or in addition to the back gate. In particular, a voltage applied to the back gate and/or to the alternative top gate may both represent the transient effects of the artificial synapse—i.e., the neuromorphic memory element—i.e., the short term plasticity dynamics.

According to another design and thus to some further alternative embodiments of the neuromorphic memory element, the memristive device may also comprise a second top gate adjacent to a first side of the memristive active channel. The second top gate may also be positioned on the same dielectric layer as the active channel Thus, this second top gate is not above the active channel if seen from the carrier material but beside the active channel. It may also be denoted as side gate because it may be positioned on one side of the active channel in the same horizontal plane.

In addition, and according to an additional embodiment of the neuromorphic memory, the memristive device may also comprise a third top gate adjacent to a second side of the memristive active channel, on an opposite side of the memristive active channel than the second top gate. The second and the third top gate may build another form of the top gate. So, the active channel may be positioned in-between the second and the third top gate. Thus, the second top gate, the active channel and the third top gate may all be positioned atop the dielectric layer, i.e., in the same horizontal plane.

Some advanced embodiments of the inventive concept may also comprise a plurality of the neuromorphic memory elements, wherein the control signal terminal may be common to a plurality of the neuromorphic memory elements. With this, the control signal terminal may be adapted for emulating more global effects of volatile biological neural processes. Hence, no single memristors of different neuromorphic memory elements may be selected one after the after other, but a global control terminal (i.e., gate signal) may be sufficient to address a larger number of neuromorphic memory elements at once.

The conductance of the memristor may be both decreased or increased, depending on the gate voltage polarity. If the global gate and the top gate have different polarities, the field effect to the memristor may be nullified.

In the following, a detailed description of the figures will be given. Instructions in the figures are schematic. Firstly, a block diagram of an embodiment of the inventive neuromorphic memory element is given. Afterwards, further embodiments, as well as embodiments of the plurality of memristor and the plurality of the neuromorphic memory and the method for operating a neuromorphic memory element comprising a memristor, will be described.

FIG. 1 shows an embodiment of the neuromorphic memory element 100. It comprises a memristor which comprises an input signal terminal 104, an output signal terminal 106, and a control signal terminal 110. Between the input signal terminal 104 and the output signal terminal 106, a memristive active channel 108—i.e., a channel element—comprises a phase change material, which is the active channel. The memristive active channel extends longitudinally between the input signal terminal and the output signal terminal, i.e., its extension vertically to a first direction, defined by a line between the input signal terminal 104 and the output signal terminal 106, is smaller than in the first direction.

By this, a control signal voltage Vgs at the control signal terminal is configured to represent volatile biological neural processes of the neuromorphic memory element, and a bias voltage Vd between the input signal terminal and the output signal terminal is configured to represent non-volatile biological neural processes of the neuromorphic memory element.

The neuromorphic memory element 100 can also comprise—in order to give it physical stability—a carrier material 102, e.g., a semiconductor like silicon, and a dielectric layer 112 between the carrier material 102 on the one side and the input terminal 104, the active channel 108 and the output terminal 106 on the other side. Hence, the input terminal 104, the active channel 108 as PCM and the output terminal 106 lie in one plane, i.e., over the dielectric layer 112. Both, a second terminal of the control signal voltage Vgs and the input source terminal 104 may also be connected to ground.

FIG. 2 shows an alternative embodiment 200 of the neuromorphic memory element. In addition to the elements already discussed in the context of FIG. 1, a second dielectric layer 202 is positioned atop the active channel 108 comprising the memristive material. The second dielectric layer 202 isolates the top gate 204 from the active channel 108. In this configuration, the short-term dynamic plasticity neuromorphic memory element may be emulated by the top gate. Because the second dielectric material 202 may be much thinner than the substrate 102, the top gate may be much smaller and may require a smaller amount of electrical charge in order to influence the active channel 108 if compared to the back gate 110 on the other side of the carrier material 102.

However, one single back gate 110 may actively influence a plurality of neuromorphic memory elements 100, representing a global modulation of an array of neuromorphic memory elements 100 on a chip or wafer level. Alternatively, also the top gate may be used for the same purpose. A pure a local modulation may also be achieved by the embodiment shown in the next figure.

FIG. 3 shows an embodiment 300 having a second top gate 302 and optionally also a third top gate 304. FIG. 3 is, in contrast to FIGS. 1 and 2 (side view our cross-section), a top view onto the neuromorphic memory element 100. The active channel 108 is here positioned between the second top gate 302 and the third top gate 304. Both top gates 302, 304 may also be positioned on the dielectric layer 110. The second top gate 302 and the third top gate 304 may advantageously be used for local modulations of the active channel 108, i.e., work on an individual device level. In this configuration, a first top gate may additionally be positioned atop the active channel as it is shown in FIG. 2. Furthermore, in other configurations, the back gate 110 may also be present.

Hence, in any case, the neuromorphic memory element 100 is at least a three-terminal device. The input signal terminal 104 may also be denoted as a drain, whereas the output signal terminal 106 may also be denoted as source. The third terminal—i.e., the gate or control terminal—can be unique to a memristor of a single neuromorphic memory element or be shared by multiple memristors in several distinct neuromorphic element units (NME). Each NME can thereby emulate the LTP dynamics via non-volatile modulation of the memristive conductance during the write (programming) operation; each NME can emulate the STP dynamics via volatile modulation of the memristive conductance during the read operation. Additionally, each NME can emulate the neural dynamics via volatile modulation of the memristive conductance during both the read and the write operations.

FIG. 4A illustrates the effect of homeoplasticity using a global gate. FIG. 4A shows an arrangement 400 of presynaptic elements 404 and postsynaptic elements 406 while element 408 in combination with the connections shown in the rectangular 402 represents artificial synapses and their respective synaptic effects. In mammals, brain global mechanisms modulate the neural processing, i.e., homeoplasticity. Ionic concentrations, concentration of various hormones and temperatures are some of the parameters that provide global regulation of synaptic strength and neuronal firing. Homeoplasticity can be rendered with a neuromorphic chip using the global dating scheme. These so-called global clock concepts can be utilized for adaptive learning, while neuronal firing can be both enhanced or depressed. This is akin to accept increasing and inhibitory responses of mammalian synapses to psychedelic pharmaceutics.

FIG. 4B shows presynaptic signals 410 and postsynaptic 414 signals depending on a voltage 410 applied to a global gate. Without a voltage applied to the global gate, the amplitude of the presynaptic signals 410 and postsynaptic signals 414 may be seen as at a 100% level. However, if a positive voltage 410 is applied to the global gate during the time period 416, the postsynaptic signals 414 are shown clearly below the 100% level.

On the other side, if a negative voltage 410 is applied to the global gate during the time period 418, the postsynaptic signals 414 are shown clearly above the 100% level. After the time period 418 and without a gate voltage signal 412, the presynaptic signals 410 and the postsynaptic signals 414 are again at the respective 100% level. Thus, postsynaptic signals 414 may be increased or decreased for one neuromorphic memory element, or globally for a plurality of neuromorphic memory elements, depending on the gate design.

FIG. 5A shows an embodiment 500 for a first approach for STP utilizing a global gate, wherein asynchronous inputs X are used to address R of neuromorphic devices. Line 502 symbolizes an input line of input signal pulses $X(t_i)$, e.g., at times $t_3$, $t_2$, $t_1$ i.e., $X(t_3)$, $X(t_2)$, $X(t_1)$ for input for read and write operations for the weights to be read or to be written (i.e., programmed) from or into the respective memristor. Two units, a modulation signal detector 504 and a 2-terminal input routing module 506 control which signals will reach a specific one of the memristors 508, 510, 512 (symbolized by the switch 514). The two terminals mentioned-above are source and drain of the above-described device.

The inputs to the two terminals and the global gate are asynchronous to each other. For a 2-terminal input impulse $(X(t_i), R_j)$ at time $t_i$, the input to the $3^{rd}$ terminal (i.e., the gate) of the device $R_j$ a time $t_i$ must equal $f_j(t_i)$ (i.e., R(t) are inputs to encode f). At other times, it can be any other signal. So, it can be $F_0=0$ or it can be $f_k$, $k \neq j$. Therefore, a single global signal to the gate of all memristive devices can be used if it switches the signal that is relevant at every time $t_i$. This is the task of the modulating signals selector 504. Symbols 516 show relevant function values f over time.

FIG. 5B shows typical signal developments of time emulating device level STP-fatigue, which can be understood as a transient decrease in the synaptic efficacy from the applied volatile effects that are triggered as when the pre-synaptic inputs arrive. Signal 518 show the input signal impulses, signal 520 shows an output signal without a gate voltage applied, and signal 522 shows an output signal with an applied gate voltage (as selected by the modulating signals selector 502).

FIG. 6 shows an embodiment 600 for a second approach for STP utilizing a global gate, wherein asynchronous inputs X are used to addresses R of neuromorphic devices. Apart from only slight differences, if compared to FIG. 5A, the same reference numerals are used and not detailed again.

Additionally, jitter is introduced. By jittering the 2-terminal inputs to not coincide and still use the global signal switching scheme, the jitter must be either: (i) small relative to temporal dynamics of the gate modulating signal, or (ii) applied to the gate terminal too. Additionally, the jitter must be small relative to the temporal dynamics of the 2-terminal input.

Therefore, synapses that are required to stay immune to global gate actions may be used in parallel to the global gate input and be modulated with the top gate (as described above), but with a gate polarity that opposes the field effect from the bottom gate. The main differences between FIG. 5A and FIG. 6 are the input signals X(t) to memristors R(t) at 602 and how the modulating signal detector 504 functions.

FIG. 7 shows an example embedding of a plurality of the neuromorphic memory elements 706 into a crossbar array 700. The crossbar array 700 comprises horizontal word lines 702 (only one of which has a reference numeral), and vertical bit lines 704 (only one of which has a reference numeral) for addressing the plurality of the neuromorphic memory elements 706 at the respective crossing points. The word lines 702 and the bit lines 704 are used for addressing the respective neuromorphic memory elements 706 (or also 708, by way of example). The word lines 702 can be activated by the terminals 714, 716, 718. Terminals for the bit lines 704 are not explicitly shown. The crossbar array represents am x n matrix with rows of neuromorphic memory elements 706 from $G_{11}$ to $G_{m1}$ down to $G_{n1}$ to $G_{nm}$.

Additionally, gate contacts 712 (e.g., for the lower right corner of the crossbar array) are shown for each neuromorphic memory elements 706. These gate contacts are connected diagonally if compared to the word lines 702 and the bit lines 704. The diagonal gate lines (no explicit reference numeral) connect a plurality of the neuromorphic memory elements 706 across diagonally positioned crossing points of the word line 702 and the bit line 704. Gate voltage can be applied to the gate terminals 720, . . . , 730. The respective gate voltage will only become effective for addressed neuromorphic memory elements 706. The gates may be any gate selected from a back gate and any form of top gates. Additionally, there may be parallel gate lines to differentiate between a back gate and one of the top gates.

FIG. 8 shows components 800 for operating the crossbar array of the plurality of the neuromorphic memory elements in the crossbar array 700. The word lines (only three of which are shown) are be connected to digital/analog converters 802, converting read or write commands to pulses 804. The bit lines are connected to amplifiers 806, which are in turn connected to analog/digital converters 808. This way, the cross by array 700 may be addressed digitally and the outcome of the crossbar array may also be processed digitally.

Furthermore, symbolically, the connections to the gate lines are shown while the digital to analog converter 810 connected to global gate contacts the neuromorphic memory elements 706 of the crossbar 700. Furthermore, additional digital/analog converters 812 are shown for addressing the local gates (not explicitly shown in FIG. 7 and FIG. 8) which are typically implemented as top gates. These gates are controlled by the volatile signals 814 symbolically shown as decreasing signals over time.

The descriptions of the various embodiments have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein. Any advantages of particular embodiments do not necessarily apply to all embodiments, and a particular embodiment need not employ all of the advantages discussed herein.

The present disclosure may cover a system, and a method, and/or may be implemented together with a computer program product. The computer program product may include a computer readable storage medium (or media) having computer readable program instructions thereon for causing a processor to carry out aspects of the present invention.

The medium may be an electronic, magnetic, optical, electromagnetic, infrared or a semi-conductor system for a propagation medium. Examples of a computer-readable medium may include a semi-conductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), DVD and Blu-Ray-Disk.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disk read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object-oriented programming language such as Smalltalk, C++ or the like, and conventional procedural programming languages, such as the "C" programming language or similar programming languages. The computer readable program instructions may execute entirely on the user's computer, partly on the user's computer as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatuses, or another device to cause a series of operational steps to be performed on the computer, other programmable apparatus or other device to produce a computer implemented process, such that the instructions which execute on the computer, other programmable apparatuses, or another device implement the functions/acts specified in the flowchart and/or block diagram block or blocks.

The flowcharts and/or block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or act or carry out combinations of special purpose hardware and computer instructions.

The terminology used herein is for the purpose of describing particular embodiments only and is not intended to limit the invention. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

What is claimed is:

1. A neuromorphic memory element comprising a memristor, the memristor comprising:
   an input signal terminal;
   an output signal terminal;
   a control signal terminal;
   a memristive active channel comprising a phase change material;
   wherein:
   the memristive active channel extends longitudinal between the input signal terminal and the output signal terminal;
   a control signal at the control signal terminal is configured to represent volatile biological neural processes of the neuromorphic memory element; and
   a bias voltage between the input signal terminal and the output signal terminal is configured to represent non-volatile biological neural processes of the neuromorphic memory element.

2. The neuromorphic memory element according to claim 1, wherein the neuromorphic memory element is configured to emulate:
   long-term plasticity dynamics via non-volatile modulation of a memristor conductance of the memristor during a write operation;
   short-term plasticity dynamics via volatile modulation of the memristor conductance during a read operation; and
   neuronal dynamics via volatile modulation of the memristor conductance during the read and write operations.

3. The neuromorphic memory element according to claim 1, wherein the memristive device comprises:
   a carrier material having a top surface and a back surface;
   a first dielectric material layer atop the top surface of the carrier material;
   a source terminal and a drain terminal connected by the memristive active channel atop the dielectric material; and
   a back gate below the first dielectric material layer.

4. The neuromorphic memory element according to claim 3, wherein the carrier material is conductive and wherein the carrier material is the back gate.

5. The neuromorphic memory element according to claim 4, wherein the carrier material is a metal or a highly doped semiconductor.

6. The neuromorphic memory element according to claim 3, wherein the carrier material is a silicon substrate and wherein the back gate is a conductive layer atop the back surface of the silicon substrate.

7. The neuromorphic memory element according to claim 3, further comprising:
   a second dielectric material layer atop the memristive active channel; and
   a first top gate atop the second dielectric material layer.

8. The neuromorphic memory element according to claim 3, wherein the memristive device further comprises a second top gate adjacent to a first side of the memristive active channel.

9. The neuromorphic memory element according to claim 8, wherein the memristive device further comprises a third top gate adjacent to a second side of the memristive active channel and opposite of the memristive active channel to the second top gate.

10. The neuromorphic memory element according to claim 1, wherein the memristive device comprises:
    a carrier material;
    a source terminal and a drain terminal connected by the memristive active channel atop the carrier material;
    a dielectric material layer atop the memristive active channel; and
    a control gate atop the dielectric material layer.

11. A plurality of the neuromorphic memory elements, each of which is a neuromorphic memory element according to claim 1,
    wherein the control signal terminal is common to a plurality of the neuromorphic memory elements.

12. A method for operating a neuromorphic memory element comprising a memristor, the memristor comprising:
    an input signal terminal;
    an output signal terminal;
    a control signal terminal;
    a memristive active channel comprising a phase change material, wherein the memristive active channel extends longitudinal between the input signal terminal and the output signal terminal;

the method comprising:
applying a control signal voltage to the control signal terminal representing volatile biological neural processes of the neuromorphic memory element; and
applying a bias voltage between the input signal terminal and the output signal terminal representing non-volatile biological neural processes of the neuromorphic memory element.

13. The method according to claim 12, further comprising emulating, by the neuromorphic memory element:
long-term plasticity dynamics via non-volatile modulation of a memristor conductance of the memristor during a write operation;
short-term plasticity dynamics via volatile modulation of the memristor conductance during a read operation; and
neuronal dynamics via volatile modulation of the memristor conductance during the read and write operations.

14. The method according to claim 12, wherein the memristive device comprises:
a carrier material having a top surface and a back surface;
a first dielectric material layer atop the top surface of the carrier material;
a source terminal and a drain terminal connected by the memristive active channel atop the dielectric material; and
a back gate below the first dielectric material layer.

15. The method according to claim 14, wherein:
the carrier material is conductive; and
the carrier material is the back gate.

16. The method according to claim 15, wherein the carrier material is a metal or a highly doped semiconductor.

17. The method according to claim 14, wherein:
the carrier material is a silicon substrate; and
the back gate is a conductive layer atop the back surface of the silicon substrate.

18. The method according to claim 14, wherein the memristive device further comprises:
a second dielectric material layer atop the memristive active channel; and
a first top gate atop the second dielectric material layer.

19. The method according to claim 14, wherein the memristive device further comprises
a second top gate adjacent to a first side of the memristive active channel.

20. The method according to claim 19, wherein the memristive device comprises:
a third top gate adjacent to a second side of the memristive active channel and opposite of the memristive active channel to the second top gate.

* * * * *